(12) United States Patent
Savagaonkar et al.

(10) Patent No.: US 7,129,733 B2
(45) Date of Patent: Oct. 31, 2006

(54) DYNAMIC OVERDRIVE COMPENSATION TEST SYSTEM AND METHOD

(75) Inventors: Uday R. Savagaonkar, Hillsboro, OR (US); Mike R. Moran, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 207 days.

(21) Appl. No.: 10/726,747

(22) Filed: Dec. 2, 2003

(65) Prior Publication Data

US 2005/0116734 A1 Jun. 2, 2005

(51) Int. Cl.
*G01R 31/26* (2006.01)
(52) U.S. Cl. .................................................... 324/765
(58) Field of Classification Search ................ None
See application file for complete search history.

(56) References Cited

U.S. PATENT DOCUMENTS

| | | | | |
|---|---|---|---|---|
| 6,107,109 A | * | 8/2000 | Akram et al. ................. | 438/15 |
| 6,127,831 A | * | 10/2000 | Khoury et al. ............... | 324/754 |
| 6,218,848 B1 | * | 4/2001 | Hembree et al. ............ | 324/754 |
| 6,314,641 B1 | * | 11/2001 | Akram ......................... | 324/755 |
| 6,833,613 B1 | * | 12/2004 | Akram et al. ................ | 257/686 |
| 6,891,385 B1 | * | 5/2005 | Miller .......................... | 324/760 |

FOREIGN PATENT DOCUMENTS

JP 58021838 A * 2/1983 ................. 324/758

* cited by examiner

*Primary Examiner*—Jermele Hollington
(74) *Attorney, Agent, or Firm*—Marger Johnson & McCollom P.C.

(57) ABSTRACT

The invention(s) relates to a wafer test system including a circuit to communicate an overdrive to a chuck, the chuck moving a wafer towards a probe head responsive to the overdrive, a circuit to measure a contact resistance of at least one channel in each of a plurality of dies associated with the wafer using the probe head, a circuit to compute a per channel standard deviation responsive to measuring the contact resistance, a circuit to compare the standard deviation on the at least one channel to a threshold, and a circuit to increase the overdrive responsive to the comparison.

29 Claims, 4 Drawing Sheets

DYNAMIC OVERDRIVE COMPENSATION TEST SYSTEM AND METHOD

BACKGROUND OF THE INVENTION(S)

1. Field of the Invention(s)

The invention(s) relates to a semiconductor test system and method. More particularly, the invention(s) relates to a semiconductor test system and method that improves probe head to wafer contact using dynamic overdrive compensation.

2. Description of the Related Art

Semiconductor devices, e.g., wafers and integrated circuits, are typically tested at various points in their manufacture. This includes the wafer-test step, where the circuit units are tested while they are still part of a wafer and have not been packaged into individual units. Testing ensures the devices—and the manufacturing processes used to produce them—are working properly and within acceptable quality ranges.

A typical wafer-test is performed as follows. The wafer is placed on a chuck or similar mechanical tool that moves the wafer and brings the device under test (DUT) into contact with an interface unit, e.g., a sort interface unit (SIU). The SIU provides electrical signals received from a tester to the wafer through contact pins positioned on a probe head (which is a part of the SIU). The contact pins are often spring-loaded.

In some cases, the probe head flexes or bends due to the force from the chuck, resulting in poor electrical contact. Poor or inconsistent electrical contact can also result from contact pin non-planarity. That is, some pins are shorter than others such that the shorter pins do not connect to the wafer. Wafer-to-wafer variations can also contribute to poor electrical contact.

Other factors such as airflow within the prober and manufacturing floor shakes might cause enough pin movement to prevent reliable contact with the wafer. Poor or inconsistent electrical contact increases test failures, lowering yield and throughput.

One method of improving probe to wafer contact is to use Optical Z Alignment (OZA) followed by aggressive overdrive. In OZA, the chuck moves the wafer in X, Y, and Z directions to optically align it with the probe head's contact. Then, the chuck is significantly overdriven in the Z direction such that the wafer is brought into pin contact with increased force, whether necessary or not. This aggressive overdrive might cause long-term damage to the SIU and, more particularly, to the probe head. The overdrive amount is typically chosen to work with most SIUs and wafer types. As a result, a limitation of the OZA method followed by aggressive overdrive is that it does not account for SIU-to-SIU and wafer-to-wafer variations. The amount of overdrive, therefore, is chosen aggressively to envelope most SIUs and wafer lots. And the amount of overdrive is chosen without specific knowledge of the particular SIU used and the particular wafer being tested. The result is a very high overdrive that might cause long-term damage to the SIU or wafer.

Electrical Z Alignment (EZA) addresses some of the disadvantages associated with OZA. In EZA, the chuck moves the wafer closer to the SIU probe head until a bare electrical contact is established on all pins. A bare contact is established on all channels when any current flows through the pins. Once a bare contact is established on all pins, the test system overdrives the chuck to account for wafer-to-wafer variations, much like in the OZA method we describe above. Here, however, the overdrive used in the EZA method is not as aggressive or significant as it is in the OZA method. In both methods, however, the amount of overdrive is determined heuristically and its accuracy cannot be guaranteed until the product is mature.

If a contact between the probe head and the wafer is not reliable, the wafers often need to be re-tested, increasing test time and consequently, test cost.

BRIEF DESCRIPTION OF THE DRAWINGS

The foregoing and other objects, features, and advantages of the invention(s) will become more readily apparent from the detailed description that references the following drawings.

DETAILED DESCRIPTION OF THE PREFERRED EMBODIMENT

Figure 1:
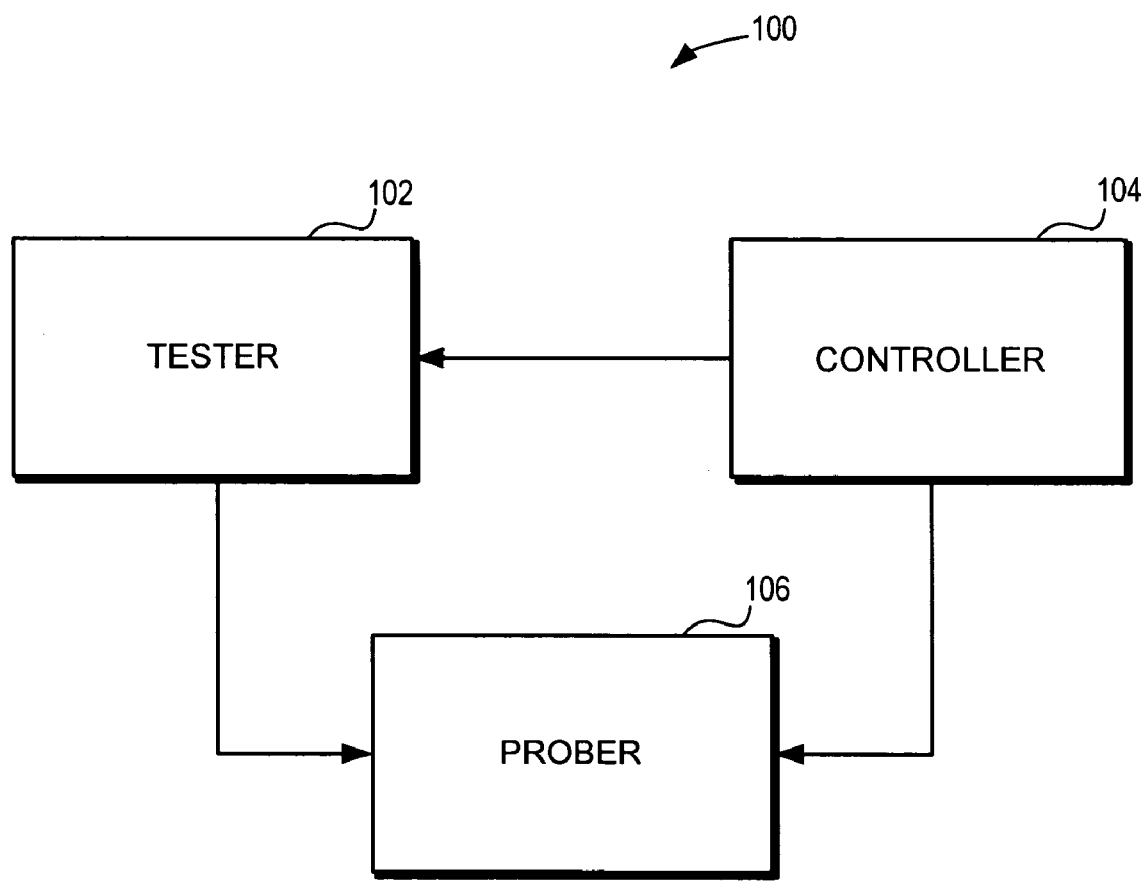
FIG. 1 is a block diagram of a test system.

FIG. 1 is a block diagram of a test system 100 according to an embodiment of the present invention. Referring to FIG. 1, a test system 100 includes a controller 104 that controls a tester 102 and a prober 106. The controller 104 determines when and what test signals the tester 102 transmits to the prober 106. And the controller 104 determines when and how the prober 106 responds to the test signals it receives from the tester 102. The prober 106, responsive to the tester 102 and the controller 104, tests a wafer (or other DUT) with the test signals it receives from the tester 102.

Figure 2:
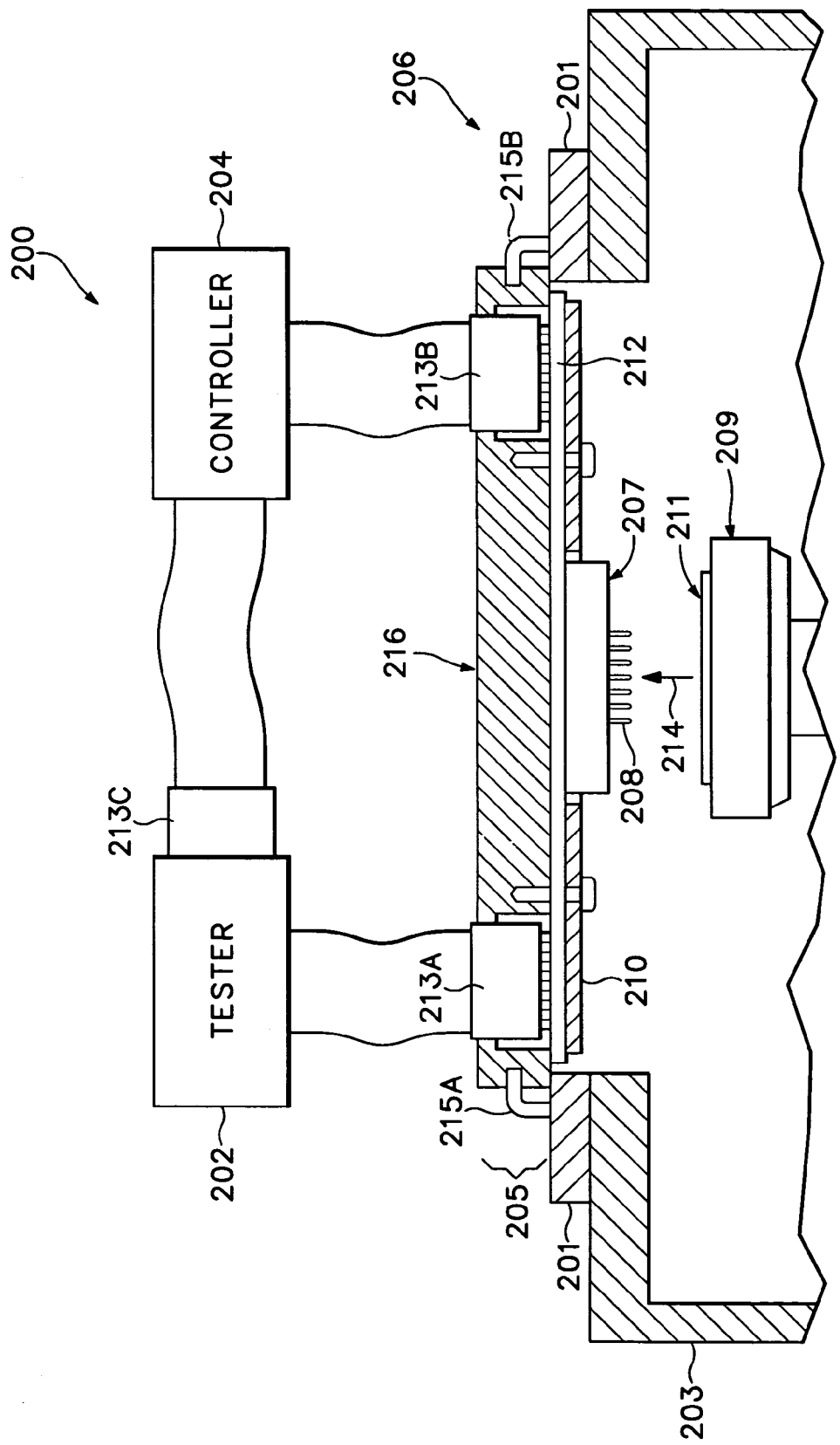
FIG. 2 is a side view block diagram of the test system shown in FIG. 1.

FIG. 2 is a more detailed side view of the test system 100 with emphasis on prober 106. Referring to FIG. 2, a test system 200 includes an interface unit 205 and a prober 206. The interface unit 205 is mounted to a top member 203 of the prober 206. A person of reasonable skill in the art should recognize that the interface unit 205 is a sort interface unit (SIU), and the wafer 211 is placed on chuck 209.

A person of reasonable skill in the art should likewise recognize that the top plate 201 might have a variety of different shapes and sizes and be made of different materials depending on the application.

The SIU 205 is mounted on the top plate 201 using a variety of fasteners, e.g., clamps 215A and 215B. A person of reasonable skill in the art should recognize other fasteners used for mounting the SIU 205 to the top plate 201, including screws, clips, hinges, tacks, nails, and the like. The SIU 205 interfaces the wafer 211 (or other DUT) to the test head 207.

The SIU 205 is unique to each DUT model under test. For example, one SIU tests wafers having one design and another SIU tests wafers having another design. Thus, the SIU 205 changes at least every time the wafer design being tested changes. And the SIU 205 might be replaced if it fails or otherwise stops functioning properly within a single wafer production run. The SIU 205 might even need to be changed for routine preventive maintenance.

The SIU 205 includes a probe head 207 mounted on a printed circuit board (PCB) 212. The probe head 207 is mounted on the PCB 212 using a variety of fasteners, e.g., screws. Contact pins 208 extend outwardly from the probe head 207. In one embodiment, the contact pins 208 are spring loaded.

The PCB 212 includes electronics used to interface the tester 202 to the wafer 211. The tester 202 is capable of electrically stressing and testing the wafer 211. The PCB 212 includes traces, power planes, and a variety of components, e.g., relays, integrated circuits, capacitors, resistors, and the like. The PCB 212 might have any of a variety of shapes and come in any of a variety of sizes depending on the particular SIU 205 and wafer 211. The PCB 212 is made of a variety of well-known materials including fiberglass FR4 and the like.

The tester 202 includes electronics used to test the wafer 211 via the PCB 212, probe head 207, and contact pins 208. The tester might include logic circuitry, memory, and a microcontroller or microprocessor. The tester 202, responsive to the controller 204, simulates a variety of load and other stress conditions designed to identify faulty or marginally operative wafers 211. The tester 202 includes a connector 213A for connecting to the PCB 212. Likewise, a connector 213B connects the controller 204 to the PCB 212. A connector 213C connects the controller 204 to the tester 202.

The connector 213A electrically couples the SIU 205 to the tester 202. The connectors 213B and 213C electrically couple the controller 204 to the prober 206 and the tester 202, respectively. In some cases, the connector 213C may be replaced by virtual network connections (for example, internet connections). A person of reasonable skill in the art knows well the general design of the tester 202, controller 204, and prober 206. We will explain below how these components vary from their known general design.

In one embodiment, the SIU 205 includes a stiffener plate 210 fixedly mounted on the underside of the PCB 212. The stiffener plate 210 is mounted on the PCB 212 using a variety of fasteners, e.g., screws. The stiffener plate 210 might have a variety of shapes and sizes depending on the SIU 205 (and, more particularly the PCB 212). The stiffener plate 210 might be made of a variety of materials, e.g., stainless steel allowing the plate 210 to be both thin and strong.

In one embodiment, before the testing begins, the SIU 205 is mounted on the top plate 201 using clamps 215A and 215B. Other variations of mounting the SIU are possible (e.g., using a vacuum). The connector 213A on the tester 202 is connected to the PCB 212. The connector 213C on the controller 204 is connected to the tester 202.

Figure 3:
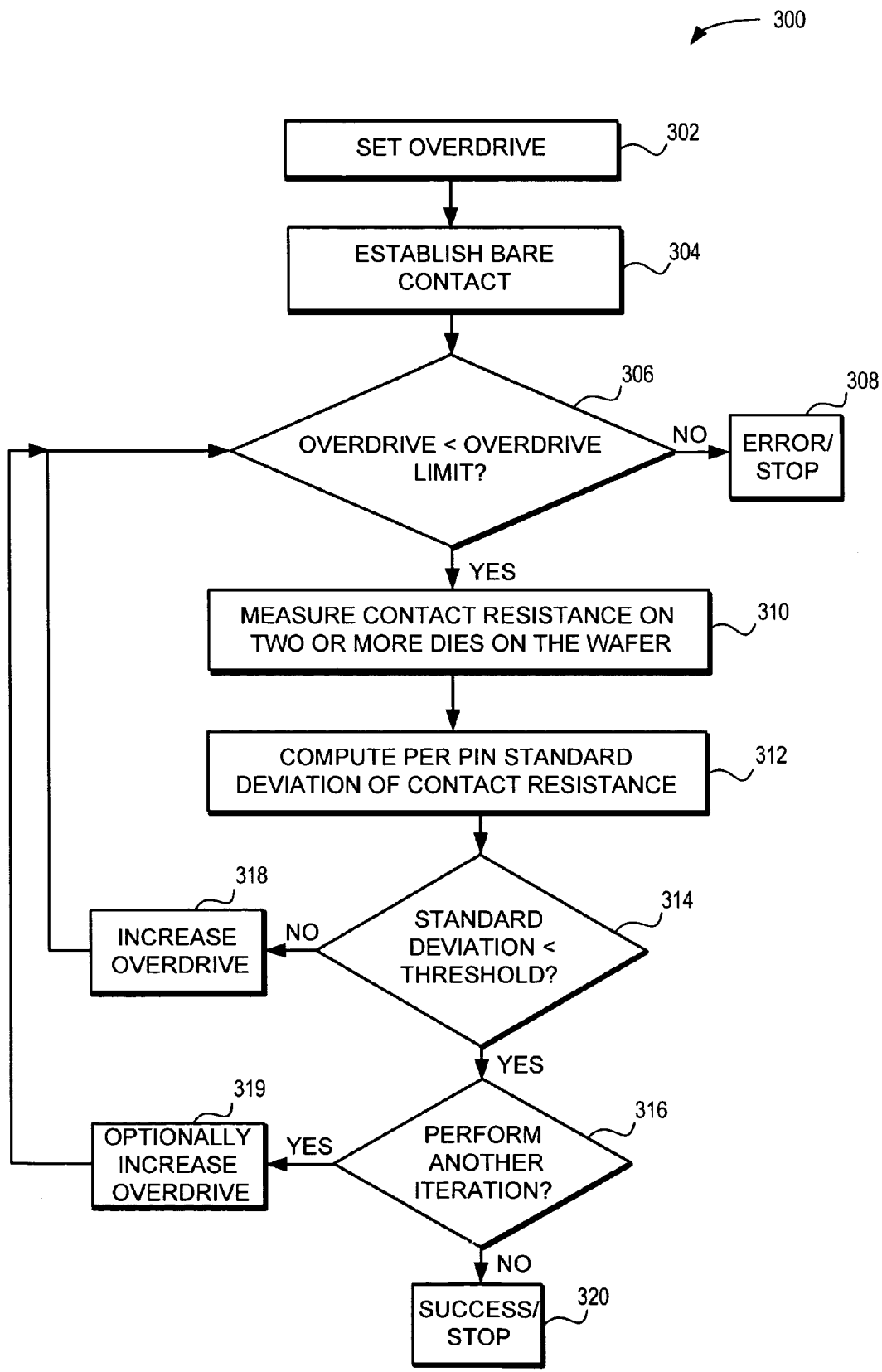
FIG. 3 is a flowchart of a technique of establishing reliable probe-to-wafer contact.

In one embodiment, the test system 200 performs the dynamic overdrive compensation (DOC) method 300 shown in FIG. 3. The DOC method 300 is described below as being performed by the controller 204 by coordinating the actions of the tester 202 and the prober 206. A person of reasonable skill in the art should, however, recognize that the method might be performed by other test components in or external to the system 200. The method 300 is not necessarily inherently related to any particular test device or other apparatus. In particular, various general-purpose machines may be used with programs or software in accordance with the teachings herein, or it may prove more convenient to construct more specialized apparatus to perform the required method. The structure for these machines will appear from the following description.

Referring to FIGS. 2 and 3, at 302, the controller 204 directs the prober 206 to set a chuck overdrive that is communicated to the chuck 209 (or other material handling equipment). The overdrive controls how far and consequently, with what force, the chuck 209 moves the wafer 211 in Z direction into contact with the probe head 207 and, more particularly, the contact pins 208. The contact pins 208 electrically connect the wafer 211 to the tester 202 via the SIU 205. As the chuck 209 pushes the wafer 211 (more precisely, the DUT on the wafer) into the contact pins 208, it exerts a probe force 214 on the SIU 205. A person with reasonable skills will identify that the prober overdrive is referred to by various names including but not limited to over-travel, Z-drive, Z-correction, and Z-travel. The controller 204 initially sets the overdrive conservatively and increments it in small steps responsive to measured contact resistance and computed results as we explain in more detail below.

At 304, the controller 204 establishes a bare contact with all pins 208 on the probe head 207. A bare contact is established when the tester measures any current flowing through a pin 208 thereby establishing a channel. In one embodiment, this is accomplished by moving the chuck 209 in the Z direction until the tester is able to force a reasonable current through the contact pins 208 at a reasonable voltage. A person with reasonable skills will identify that the reasonable voltage and current values depend on various system components, including the type of wafer being tested. A person of reasonable skill in the art should recognize other methods of establishing and/or measuring a bare contact. At 306, the tester 302 compares the overdrive set at 302 to an overdrive limit. In one embodiment, the SIU manufacturer predetermines the overdrive limit and supplies it to the SIU operators. If the overdrive is set higher than the limit, the testing stops at 308.

If, on the other hand, the overdrive is set lower than the limit, the tester 202 measures a contact resistance of at least one pin or channel associated with multiple random dies scattered throughout the wafer 211 (at 310). In one embodiment, the tester 202 measures the contact resistance of at least one channel on, e.g., five to ten different dies on the wafer.

Figure 4:
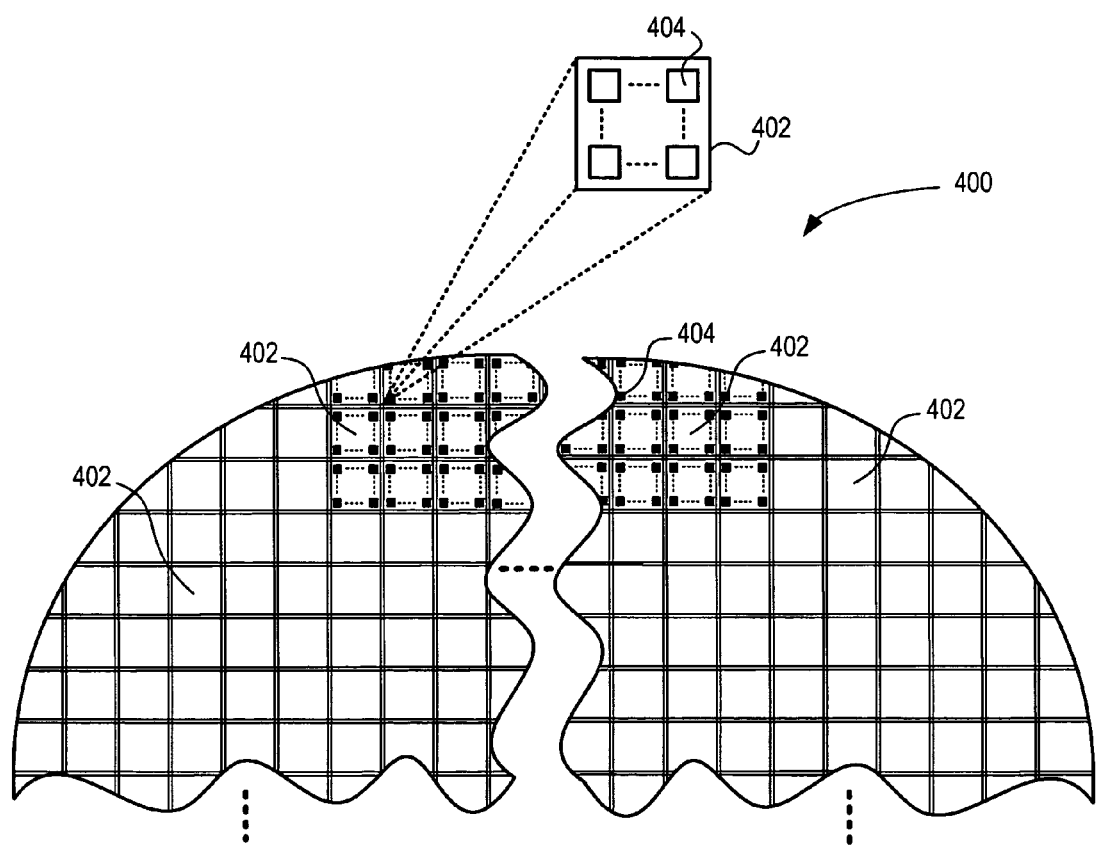
FIG. 4 is a diagram of a test wafer.

FIG. 4 is a diagram of a wafer 400 including a plurality of dies 402. Referring to FIGS. 2 and 4, each die 402 includes a plurality of contact points 404 that form a corresponding plurality of channels when connected to the contact pins 208. The chuck 209 moves the wafer in X, Y, and Z directions so that the contact pins 208 connect to the plurality of contact points 404 on the plurality of dies 402. It should be clear to a person of reasonable skill in the art that the contact pins 208 may connect to a subset of the contact points 404 on one or more dies simultaneously at any given time. The chuck 209 may reposition the wafer 211 such that the contact pins 208 connect to a subset of contact points 404 on different die(s) with each movement.

Referring back to FIGS. 2–4, in one embodiment, the tester 202 may measure the contact resistance of all (e.g., 132) channels 404 on each of a plurality of dies 402 on the wafer 400. In another embodiment, the tester 202 measures the contact resistance of a grouping of channels 404 (i.e., less than all) on each of the plurality of dies on the wafer 400. The grouping of channels 404 might be related, e.g., to their functionality. Or the grouping of channels 404 might be related to a predetermined random number of channels tested on each of the plurality of dies on the wafer 400. The controller 204 moves the chuck 209 such that the pins 208 make contact with the various dies 402 (and their associated contact points 404) on the wafer 400 and dictates the tester 202 to measure contact resistance on these dies.

The tester 202 measures contact resistance in a variety of manners. In one embodiment, the tester 202 forces a known current I (e.g., 10 mA) through a pin, measures a voltage V, and calculates the ratio of V/I.

In another embodiment, the tester 202 measures contact resistance as follows. The tester 202 forces two different values of current I (e.g., 5 mA and 15 mA) into each channel. The tester 202 then measures the corresponding voltages V. The tester 202 uses the difference between the two forced currents I and between the measured voltages V to compute the per channel contact resistance. A person of reasonable skill in the art should recognize other ways in which to measure or otherwise calculate the contact resistance.

At 312, the tester 202 computes a per-pin (or channel) contact resistance standard deviation using the plurality of per-pin contact resistance measurements available from 310. The tester 202 computes the standard deviation using well-known formulas for computing standard deviation, e.g., the square root of the sum of the square of the difference between X and X bar, divided by N or N–1 (depending on the population), where X is a contact resistance on the pin (or channel) under consideration and X bar is an average or mean of all contact resistance measurements under consideration.

At 314, the tester 202 tests the standard deviation of all pins computed at 312 to a threshold, e.g., 0.5Ω. If the standard deviation is not less than the threshold, the tester 202 increases the overdrive (at 318), compares the overdrive (at 306), measures the contact resistance (at 310), and computes the standard deviation (at 312) until the standard deviation is less than the threshold.

If, on the other hand, the standard deviation on all pins is less than the threshold, the controller 204 optionally determines whether to do a redundant iteration to ensure accurate contact between the wafer 211 and the SIU 205 (at 316). If so, the method returns to 306 after optionally increasing the overdrive at 319. Alternatively, the controller 204 might stop and report a success in establishing reliable contact at 320 directly from 314.

The method 300 identifies a DOC method that improves probe head to wafer contact. As a justification for using this method, Table 1 shows the relationship between the overdrive amount and the standard deviation of the contact resistance measurements for a properly functioning SIU 205 on a particular wafer 211. As the overdrive increases, the standard deviation of the contact resistance steadily decreases.

TABLE 1

| Overdrive (μ) | Standard Deviation (Ω) |
|---|---|
| 0 | 134 |
| 10 | 119 |
| 20 | 104 |
| 30 | 1.13 |
| 40 | .517 |
| 50 | .380 |
| 60 | .344 |
| 70 | .297 |
| 80 | .274 |

Table 2 shows the standard deviation of the contact resistance measurements as a function of the overdrive for an improperly functioning SIU 205. Even for an aggressive overdrive, the standard deviation remains high. Thus, the method 300 can additionally be used to identify a malfunctioning SIU 205 at setup, before production testing begins. Early identification of malfunctioning SIU 205s decreases test cost.

TABLE 2

| Overdrive (μ) | Standard Deviation (Ω) |
|---|---|
| 40 | 11.12 |
| 60 | 9.65 |
| 80 | 13.05 |

The DOC method 300 allows for dynamic adaptation of the overdrive to the SIU 205 (and its particular probe head) and wafer lot characteristics. In contrast, the OZA's overdrive is fixed. That is, the overdrive does not vary from one setup to another. The overdrive, therefore, must be set to accommodate a worst-case scenario that does not accommodate differences between SIUs and wafers, e.g., contact pin non-planarity between different SIUs. And higher overdrives could reduce SIU lifespan.

The adaptive nature of the DOC method 300 proves particularly valuable to low-k dielectric wafers that develop latent defects in their inter layer dielectrics due to probing pressures. And the DOC method 300 does not require heuristically determining the appropriate overdrive. As the DOC method 300 adapts to each wafer lot, the overdrive is set accurately from the first production run. Finally, the DOC method 300 determines the contact quality before wafer sorting. This reduces the number of resorts performed due to poor contact. A poor contact impairs proper power delivery that, in turn, affects the device's frequency or power performance, even if the device has a potential of performing better under a good contact. The DOC method 300, because of its ability to establish a good contact, has the potential to reduce incorrect categorization by accurately measuring the performance of a device. The DOC also has metrology benefits because of the per channel data it generates at setup.

Having illustrated and described the principles of our invention(s), it should be readily apparent to those skilled in the art that the invention(s) can be modified in arrangement and detail without departing from such principles. We claim all modifications coming within the spirit and scope of the accompanying claims.

We claim:

1. A test method, comprising:
    setting an overdrive;
    measuring a contact resistance of at least one channel in each of a plurality of dies on a wafer;
    computing a per channel standard deviation responsive to measuring the contact resistance;
    comparing the standard deviation on the at least one channel to a threshold; and
    increasing the overdrive responsive to comparing the standard deviation.

2. The test method of claim 1 where measuring the contact resistance on the at least one channel comprises:
    forcing a current through the at least one channel;
    measuring a voltage on the at least one channel; and
    calculating the contact resistance responsive to the forcing and measuring.

3. The test method of claim 1 where measuring the contact resistance comprises measuring the contact resistance on all channels on each of the plurality of dies.

4. The test method of claim 1 where measuring the contact resistance comprises measuring contact resistance on a group of channels on each of the plurality of dies.

5. The test method of claim 1 where measuring the contact resistance comprises measuring the contact resistance of all of the dies on the wafer.

6. The test method of claim 1 where measuring the contact resistance comprises measuring the contact resistance of a group of dies on the wafer.

7. The test method of claim 1 comprising establishing a bare contact with the at least one channel on each of the plurality of dies prior to setting the overdrive.

8. The test method of claim 1 comprising comparing the overdrive to an overdrive limit prior to measuring the contact resistance.

9. The test method of claim 1 comprising increasing the overdrive if the standard deviation on the at least one channel of each of the plurality of dies is less than the threshold.

10. The test method of claim 1 comprising repeating measuring the contact resistance and computing the standard deviation responsive to comparing the standard deviation.

11. A test apparatus, comprising:
means for setting an overdrive;
means for measuring a contact resistance on each of a plurality of dies in a wafer;
means for computing a standard deviation for each contact resistance measured responsive to the means for measuring the contact resistance; and
means for increasing the overdrive responsive to the means for computing the standard deviation.

12. The test apparatus of claim 11 where the means for measuring the contact resistance includes means for measuring a contact resistance on at least one channel in each of the plurality of dies.

13. The test apparatus of claim 11 comprising means for establishing a bare contact with each of the plurality of dies on the wafer.

14. The test apparatus of claim 11 comprising means for comparing the overdrive to an overdrive limit prior to measuring the contact resistance.

15. The test apparatus of claim 11 where the means for increasing the overdrive increases the overdrive if the standard deviation is less than a predetermined threshold.

16. A wafer test system, comprising:
a tester adapted to generate wafer test signals;
a wafer including a plurality of dies, each die having a plurality of channels;
a probe head including a plurality of pins to probe the plurality of channels on each of the plurality of dies on the wafer; and
a chuck to place the wafer in contact with the probe head;
where the tester is to:
communicate an overdrive to the chuck, the chuck moving the wafer towards the probe head responsive to the overdrive;
measure a contact resistance of at least one channel in each of the dies of the wafer using the probe head;
compute a per channel standard deviation responsive to measuring the contact resistance;
compare the standard deviation on the at least one channel to a threshold; and
increase the overdrive responsive to the comparison.

17. The wafer test system of claim 16 where the tester is to measure the contact resistance by:
forcing a current through the at least one channel;
measuring a voltage on the at least one channel; and
calculating the contact resistance responsive to the forcing and measuring.

18. The wafer test system of claim 16 where the tester is to measure the contact resistance by measuring the contact resistance on all channels on each of the plurality of dies.

19. The wafer test system of claim 16 where the tester is to measure the contact resistance by measuring the contact resistance on a group of channels on each of the plurality of dies.

20. The wafer test system of claim 16 where the probe head is to establish a bare contact with all channels on each of the plurality of dies on the wafer prior to the tester setting the overdrive.

21. The wafer test system of claim 16 where the tester is to compare the overdrive to a limit prior to measuring the contact resistance.

22. The wafer test system of claim 16 where the tester is to increase the overdrive if the standard deviation on all channels is less than the threshold.

23. The wafer test system of claim 16 where the tester is to repeat measuring the contact resistance and computing the standard deviation responsive to comparing the standard deviation.

24. An article comprising a storage medium having stored thereon instructions, that, when executed by at least one device, result in:
setting an overdrive;
measuring contact resistance on at least one channel in each of a plurality of dies on a wafer;
computing a per channel standard deviation responsive to measuring the contact resistance;
comparing the standard deviation on at least one channel to a threshold; and
increasing the overdrive responsive to comparing the standard deviation.

25. The article of claim 24 where measuring the contact resistance on the at least one channel comprises:
forcing a current through the at least one channel;
measuring a voltage on the at least one channel; and
calculating the contact resistance responsive to the forcing and measuring.

26. The article of claim 24 comprising establishing a bare contact with all channels on each of the plurality of dies on the wafer prior to setting the overdrive.

27. The article of claim 24 comprising comparing the overdrive to an overdrive limit prior to measuring the contact resistance.

28. The article of claim 24 comprising increasing the overdrive if the standard deviation on all channels is less than the threshold.

29. The article of claim 24 comprising repeating comparing the overdrive, measuring the contact resistance, and computing the standard deviation responsive to comparing the standard deviation.

* * * * *